(12) United States Patent
Sarin

(10) Patent No.: US 8,031,529 B2
(45) Date of Patent: Oct. 4, 2011

(54) MEMORY CELL THRESHOLD VOLTAGE DRIFT ESTIMATION METHODS AND APPARATUS

(75) Inventor: Vishal Sarin, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/871,252

(22) Filed: Aug. 30, 2010

(65) Prior Publication Data

US 2010/0321995 A1 Dec. 23, 2010

Related U.S. Application Data

(63) Continuation of application No. 12/330,077, filed on Dec. 8, 2008, now Pat. No. 7,787,307.

(51) Int. Cl.
*G11C 11/34* (2006.01)
(52) U.S. Cl. ............. 365/185.24; 365/185.2; 365/210
(58) Field of Classification Search ............. 365/185.24, 365/185.2, 210
See application file for complete search history.

(56) References Cited

U.S. PATENT DOCUMENTS

| | | | |
|---|---|---|---|
| 5,600,593 A * | 2/1997 | Fong | ............ 365/185.19 |
| 7,158,415 B2 | 1/2007 | Bedarida et al. | |
| 2006/0140030 A1 | 6/2006 | Bedarida et al. | |
| 2006/0209594 A1 * | 9/2006 | Pio et al. | ............ 365/185.03 |
| 2007/0253248 A1 | 11/2007 | Maayan et al. | |
| 2007/0263455 A1 * | 11/2007 | Cornwell et al. | ............ 365/185.28 |

OTHER PUBLICATIONS

Sarin, et al.; "Cell Deterioration Warning Apparatus and Method"; U.S. Appl. No. 11/881,423, filed Jul. 27, 2007; Total Pages: 33.
Sarin, et al.; "Memory Device Reference Cell Programming Method and Apparatus"; U.S. Appl. No. 12/236,892, filed Sep. 24, 2008; Total Pages: 31.

* cited by examiner

*Primary Examiner* — Son Dinh
(74) *Attorney, Agent, or Firm* — Leffert Jay & Polglaze, P.A.

(57) ABSTRACT

Methods of operating memory devices include determining a threshold voltage drift of two or more reference memory cells of the memory device programmed to only a subset of data states of the memory device and, using the determined threshold voltage drift of the two or more reference memory cells, estimating a threshold voltage drift of one or more user data memory cells programmed to a data state of the memory device that is mutually exclusive to the subset of data states of the memory device. Apparatus include memory devices having an array of memory cells having one or more user data memory cells and two or more reference memory cells, and control circuitry configured to maintain locations and initial programmed threshold voltages of the two or more reference memory cells corresponding to only a subset of data states of the memory device.

26 Claims, 9 Drawing Sheets

MEMORY CELL THRESHOLD VOLTAGE DRIFT ESTIMATION METHODS AND APPARATUS

RELATED APPLICATION

This application is a Continuation of U.S. application Ser. No. 12/330,077, titled "MEMORY CELL SHIFT ESTIMATION METHOD AND APPARATUS," filed Dec. 8, 2008, now U.S. Pat. No. 7,787,307 issued on Aug. 31, 2010, which is commonly assigned and incorporated herein by reference.

TECHNICAL FIELD

The present disclosure relates generally to semiconductor memory and more particularly, in one or more embodiments, to non-volatile memory devices.

BACKGROUND

Flash memory devices have developed into a popular source of non-volatile memory for a wide range of electronic applications. Flash memory devices typically use a one-transistor memory cell (e.g., floating gate) that allows for high memory densities, high reliability, and low power consumption. Changes in threshold voltage of the cells, through programming of charge storage or trapping layers or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

Flash memory typically utilizes one of two basic architectures known as NOR Flash and NAND Flash. The designation is derived from the logic used to read the devices. FIG. 1 illustrates a NAND type flash memory array architecture 100 wherein the floating gate memory cells 101 of the memory array are arranged in a matrix of rows and columns. The memory cells 101 of the array are also arranged together in strings, typically of 8, 16, 32, or more each, where the memory cells in a string are connected together in series, source to drain, between a common source line 120 and a data line 122, often referred to as a bit line. The array is then accessed by a row decoder activating a row of floating gate memory cells (e.g., 132-138) by selecting a particular access line (e.g., 130), often referred to as a word line, connected to their gates. In addition, bit lines BL0-BL3 122-128 can also be driven high or low depending on the current operation being performed. As is known to those skilled in the art, the number of word lines and bit lines might be much greater than those shown in FIG. 1.

Bit lines BL0-BL3 122-128 are coupled to sensing devices (e.g., sense amplifiers) 140-146 that detect the state of each cell by sensing current on a particular bit line 122-128. The word lines WL7-WL0 104-116 and 130 select the individual memory cells 101 in the series strings to be written to or read from and operate the remaining memory cells in each series string in a pass through mode. Each series string of memory cells is coupled to a source line 120 by a source select gate 150 and to an individual bit line BL0 122 by a drain select gate 148, for example. The source select gates, such as 150, are controlled by a source select gate control line SG(S) 118 coupled to their control gates. The drain select gates, such as 148, are controlled by a drain select gate control line SG(D) 102.

As the performance and complexity of electronic systems increases, the requirement for additional memory in systems also increases. However, in order to continue to reduce the costs of the system, it is desirable to keep the parts count low. This can be accomplished by increasing the memory density of an integrated circuit by using such technologies as multi-level cells (MLC). For example, MLC NAND flash memory is a cost effective non-volatile memory.

Multilevel memory cells assign a data state (e.g., as represented by a bit pattern) to a specific range of threshold voltages (Vt) stored on the memory cell. Single level memory cells (SLC) permit the storage of a single binary digit (e.g., bit) of data on each memory cell. Meanwhile, MLC technology permits the storage of two or more binary digits per cell (e.g., 2, 4, 8, 16 bits), depending on the quantity of threshold voltage ranges assigned to the cell and the stability of the assigned threshold voltage ranges during the lifetime operation of the memory cell. The number of threshold voltage ranges, which are sometimes referred to as Vt distribution windows, used to represent a bit pattern comprised of N-bits is $2^N$. For example, one bit may be represented by two ranges, two bits by four ranges, three bits by eight ranges, etc. Some memory cells can store fractional numbers of bits, such as 1.5 bits per cell. A common naming convention is to refer to SLC memory as MLC (two level) memory as SLC memory utilizes two data states in order to store one bit of data as represented by a 0 or a 1, for example. MLC memory configured to store two bits of data can be represented by MLC (four level), three bits of data by MLC (eight level), etc. An MLC (four level) memory cell is typically referred to as a lower density memory cell than an MLC (eight level) memory due to the lower number of bits stored per memory cell, for example. SLC (e.g., MLC (two level)) is typically referred to as a lower density memory than MLC (four level) memory and so on.

FIG. 2 illustrates an example of a Vt distribution 200 for a MLC (four-level) memory cell. For example, a cell may be programmed to a Vt that falls within one of four different voltage ranges 202-208 of 200 mV, each being used to represent a data state corresponding to a bit pattern comprised of two bits. Typically, a dead space 210 (which is sometimes referred to as a margin) of 0.2V to 0.4V is maintained between each range to keep the ranges from overlapping. As one example, if the voltage stored on the cell is within the Vt range 202, the cell in this case is storing a logical '11' state and is typically considered the erased state of the cell. If the voltage is within the Vt range 204, the cell in this case is storing a logical '01' state. A voltage in the range 206 of the four Vt ranges would indicate that the cell in this case is storing a logical '00' state. Finally, a Vt residing in the Vt range 208 indicates that a logical '10' state is stored in the cell.

During a typical programming operation of memory cells (e.g. a block) with user data, some additional memory cells (referred to herein as "reference cells") are programmed to a known one of the potential data states, which will be referred to herein as a reference state (e.g., a known threshold voltage.) Over time, the threshold voltages programmed in memory cells, including the reference cells, may shift (e.g., drift) by some amount. Thus, due to their proximity it is assumed that the amount of drift in a reference cell is similar to the amount of drift in a memory cell storing user data. A determination of how much drift has occurred can be made by comparing the known threshold voltage programmed into the reference cell with the threshold voltage actually read from the reference cell. Typically these reference memory cells are arranged such that a complete string comprises memory cells which are all programmed to the same reference state. Additional strings comprise memory cells all programmed to a second reference state, etc. This reference level state scheme continues for each possible data state of user data cells. For example, strings of reference cells would be programmed to each of the data states illustrated in FIG. 2 (corresponding to ranges 202-208) in the case of an array of MLC (four level) memory cells. Once the drift of the reference cells has been determined, this amount of drift can then be applied to the values read from the memory cells storing user data. However, an issue with utilizing this method of determining drift in reference cells is that memory cells which are programmed as reference cells cannot be used as memory cells to store user data. This reduces the user data capacity of the memory array.

For the reasons stated above, and for other reasons which will become apparent to those skilled in the art upon reading and understanding the present specification, there is a need in the art, for example, to reduce the number of memory cells programmed as reference cells in a memory device.

DETAILED DESCRIPTION

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Figure 1:
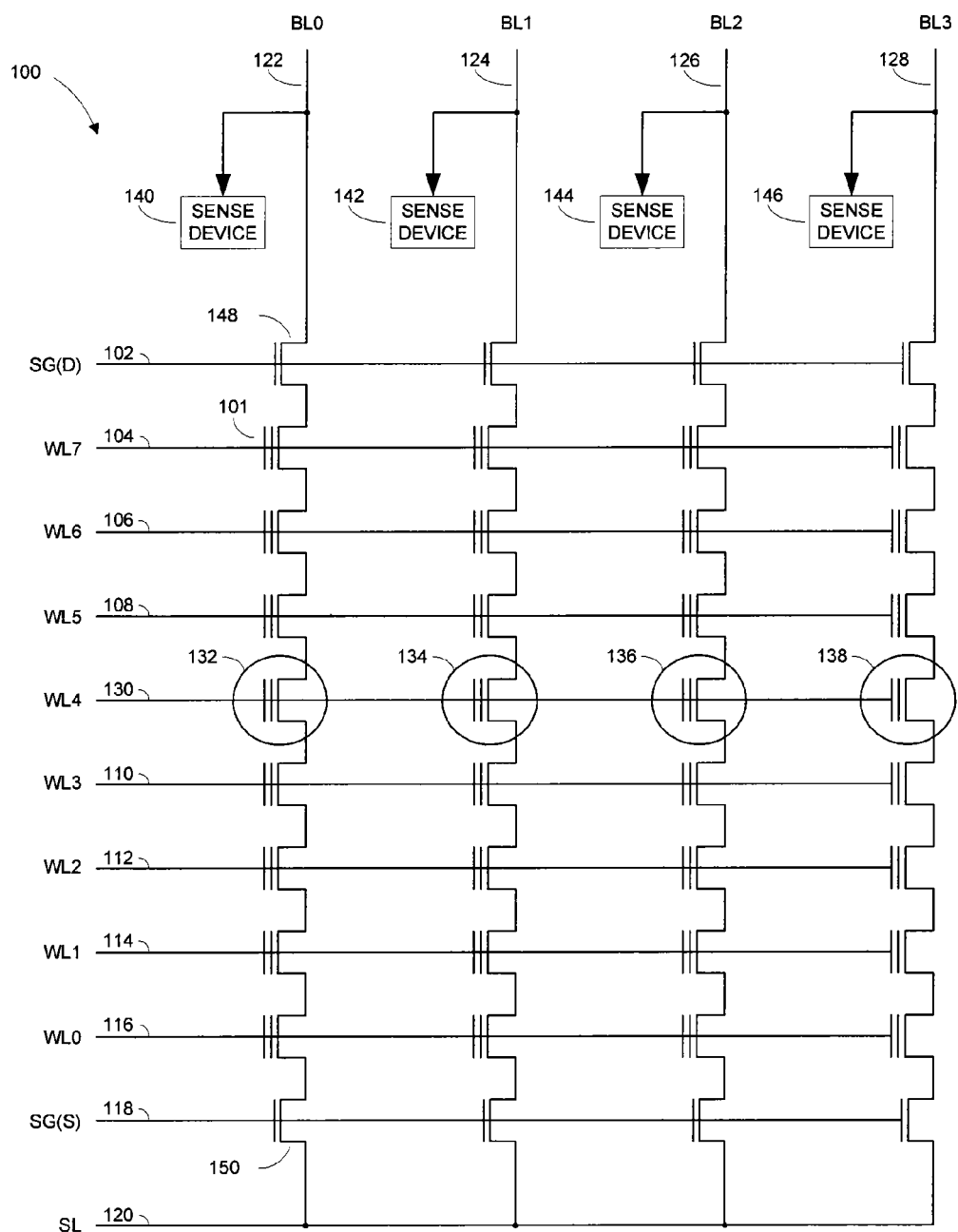
FIG. 1 shows a typical arrangement of multiple series strings of memory cells of a memory array organized in a NAND architecture.
Figure 2:
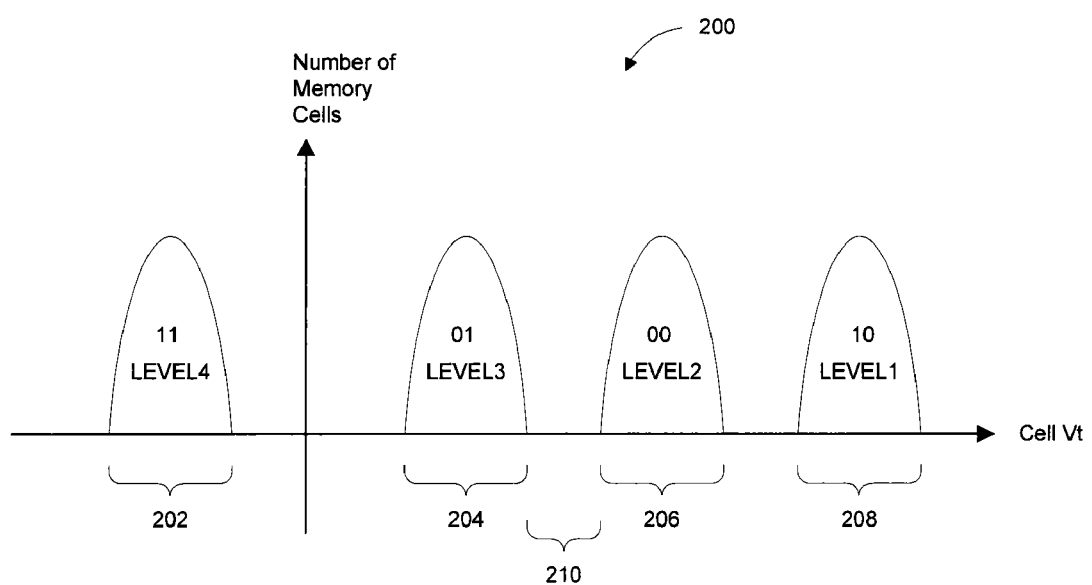
FIG. 2 shows a graphical representation of a threshold voltage distribution.
Figure 3:
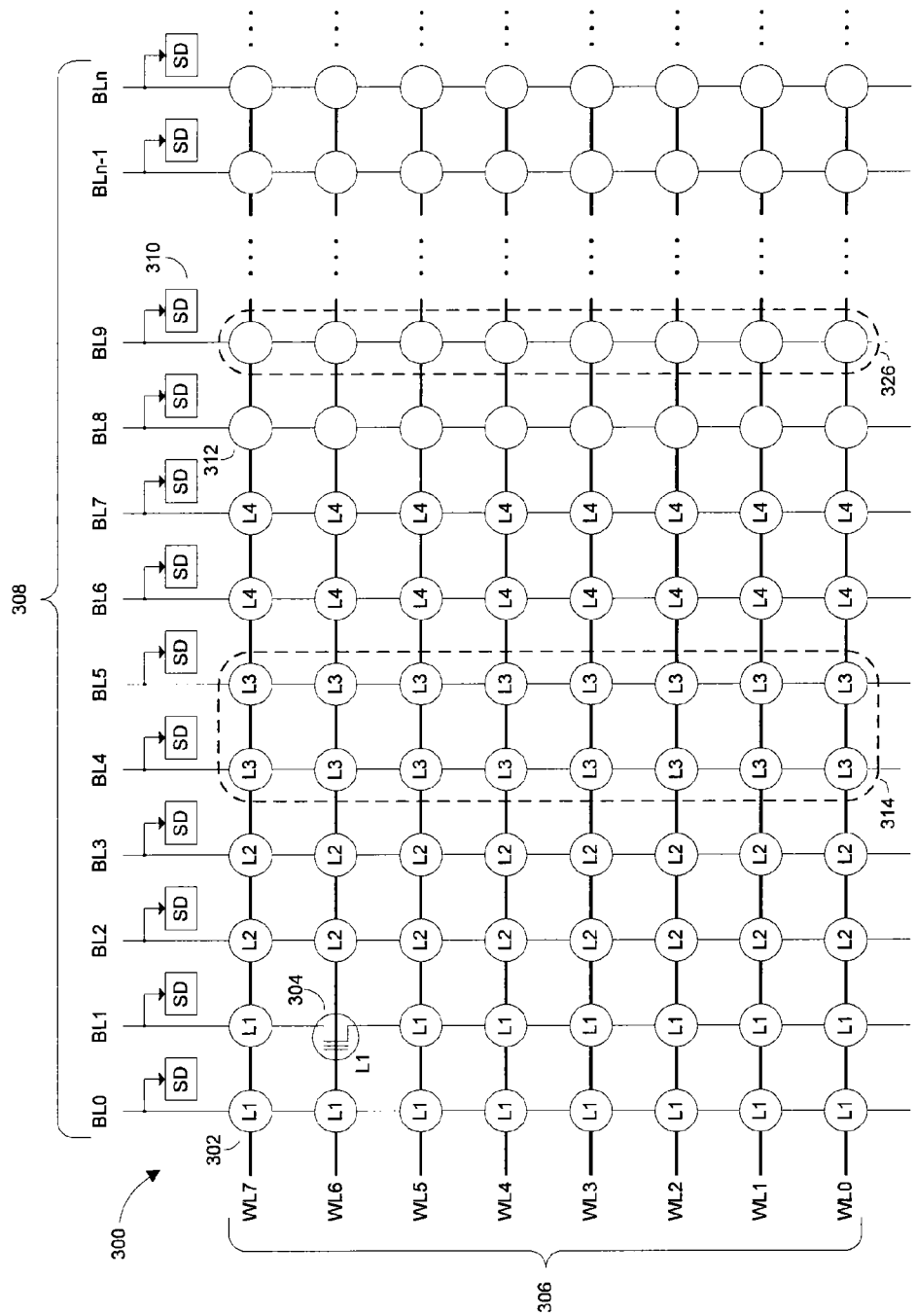
FIG. 3 shows a typical prior art arrangement of reference cells in an array of memory cells.

FIG. 3 illustrates a typical programming scheme for a number of reference cells in an array of memory cells 300. The memory array of FIG. 3 is similar to the memory array illustrated in FIG. 1. The source 120 and drain 102 lines and select gates 150/148 illustrated in FIG. 1 are not shown in FIG. 3 in order to improve the readability of the Figure. In addition, each circle 302 represents a memory cell such as a flash memory cell, for example. Memory cell 304 is shown indicating the schematic representation of a memory cell similar to its depiction in FIG. 1 and the memory cells residing at each of the circled locations 302 of FIG. 3. FIG. 3 illustrates in part reference cells which have been programmed to one of four states representing in this example an array of MLC (four level) memory cells. These reference cells are shown programmed to a particular reference state by the designation L1, L2, L3 and L4 corresponding to the ranges 208, 206, 204, 202 depicted in FIG. 2 as discussed above, for example. These reference cells (e.g., 314) are programmed to a particular data state (e.g., reference state) wherein each reference state can represent possible data states of memory cells storing user data. Memory cells programmed as reference cells at a given point in time are unavailable to store user data. User data such as provided by a host (e.g., processor), in contrast to reference data, is programmed into the user data memory cells of the array 300. Memory cells allocated for storage of user data are indicated in FIG. 3 by empty circles 312, for example. As shown in FIG. 3, a string of memory cells used for storing user data comprises only memory cells storing user data such as string 326, for example. This is in contrast to the strings of reference cells 314 which are reserved to store (e.g., be programmed to) each of the possible reference states, such as L1-L4 as shown in FIG. 3. FIG. 3 further illustrates a number of sense devices (SD) 310 such as those shown in FIG. 1 140-146. As is known to those skilled in the art, a memory array such as 300 may comprise many more word lines WL7-WL0 306 and bit lines BL0-BLn 308 than are illustrated in FIG. 3.

The programmed reference cells of FIG. 3, as indicated by L1, L2, L3 and L4 designations, are shown to be grouped together in a number of strings (e.g., columns) wherein each column comprises only memory cells which have been programmed to a particular reference state. For example, the Level3 (L3) reference cells, such as those programmed into the range 204 shown in FIG. 2, are shown as two strings of reference cells 314 all having been programmed to the same reference state. Although, each group of reference cells of array 300 are shown to comprise two strings of cells such as the group 314, one or more similarly programmed strings of cells might exist for each particular reference state.

Figure 4:
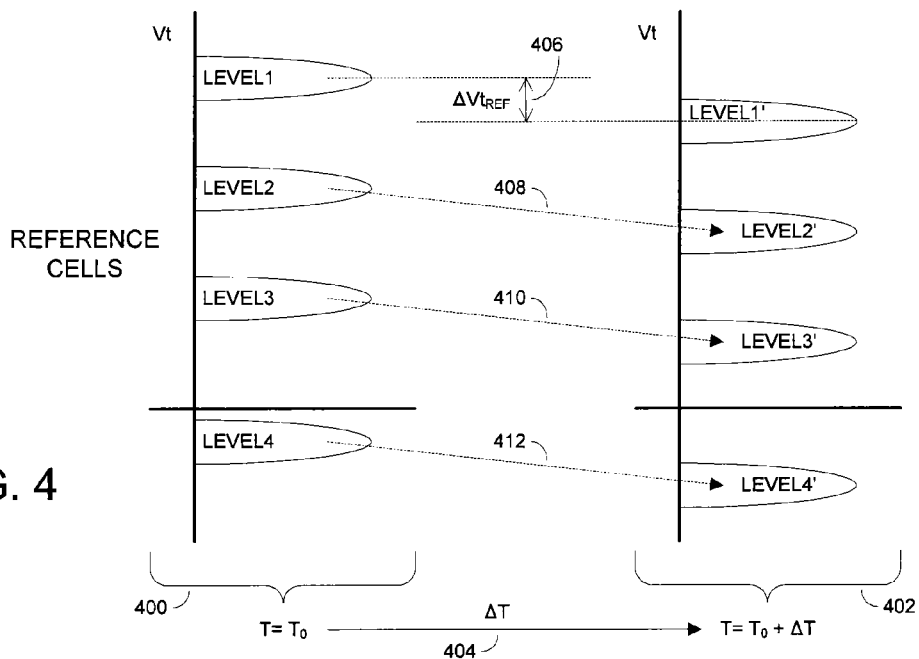
FIG. 4 illustrates a graphical plot of drift of programmed states over time of memory cells storing reference data.
Figure 5:
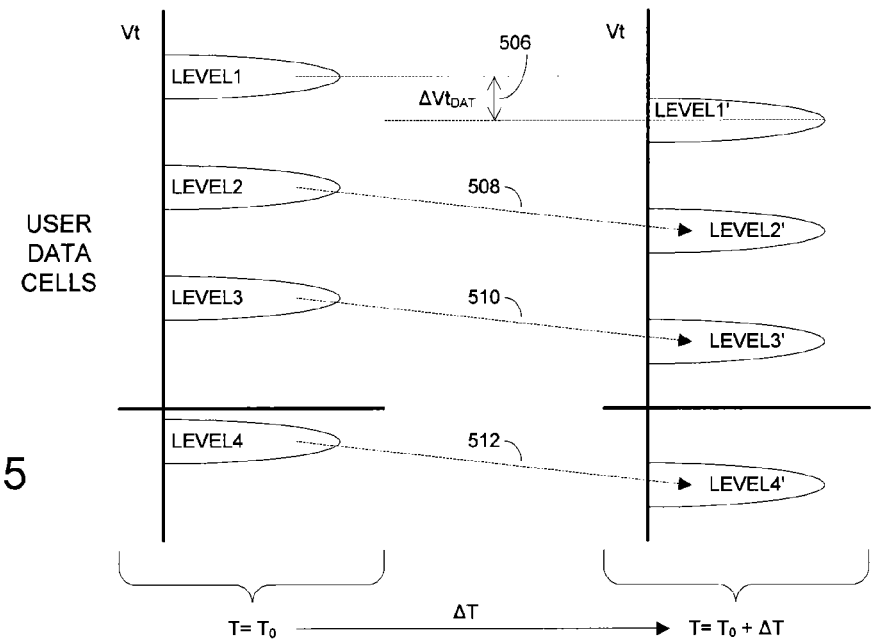
FIG. 5 illustrates a graphical plot of drift of programmed states over time of memory cells storing user data.

FIGS. 4 and 5 illustrate the potential drift of programmed reference states and user data states, respectively, that can occur over time in memory cells such as those described with respect to FIG. 3. With reference to FIG. 4, the reference memory cells, such as 314, are initially programmed to their respective reference states 400. However, FIG. 4 shows that over some time ($\Delta T$) 404, the threshold voltages of programmed reference cells may drift by some amount $\Delta V_{tREF}$ 406-412. FIG. 4 illustrates that the Vt drifts for each state 406-412 are negative and substantially equal, however other shifting directions and magnitudes are possible. It should be noted that as FIG. 3 illustrated an example of memory cells having four potential data states (L1-L4), the plot illustrated in FIG. 4 also represents that reference cells of the memory device are programmed to each of the data states L1-L4 400. Thus, each possible data state of the memory cells is represented by one or more reference cells programmed to each of the data states. As the physical locations and initial programmed threshold voltage of the reference cells are maintained by the control circuitry of the memory device, a measurement can be made of the threshold voltage of each reference cell after a period of time 404. Thus, as the initial programming condition 400 (e.g., reference state) is known, a calculation can be made to determine how much memory cells programmed to a particular reference state have drifted 406-412. The measured drift of particular reference cells 406-412 is then assumed to have occurred in user data cells 506-512. For example, $\Delta V_{tREF}$ 406 is likely to have also occurred in memory cells storing user data initially programmed to state 4, shown as $\Delta V_{tDAT}$ 506 in FIG. 5. A detailed discussion of the threshold voltage drift in programmed memory cells is included in U.S. patent application Ser. No. 11/881,423 (now U.S. Pat. No. 7,663,926) titled, "Cell Deterioration Warning Apparatus and Method," which is commonly assigned.

Figure 6:
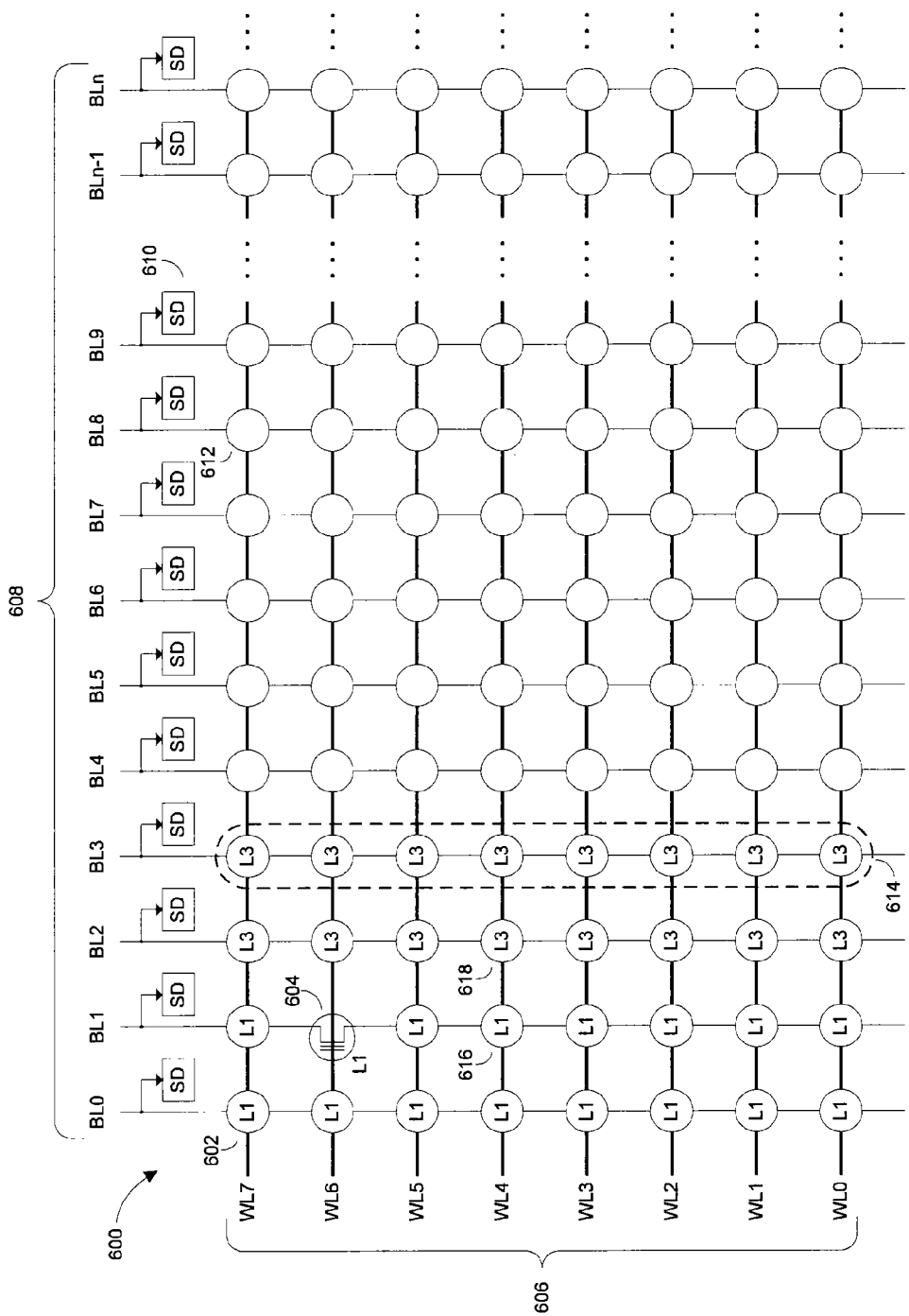
FIG. 6 shows an arrangement of reference cells in according to an embodiment of the present disclosure.

An interpolation method according to one or more embodiments of the present disclosure can be utilized to reduce the number of reference cells programmed in an array of memory cells. Such an interpolation method is described by way of reference to FIG. 6. FIG. 6 illustrates a reference cell assignment scheme according to one or more embodiments of the present disclosure. FIG. 6 illustrates an array 600 of memory cells 602/604 arranged in columns 608 (e.g., NAND strings) and rows 606. The memory cells of array 600 are in at least one embodiment MLC memory cells adapted to store four data states (e.g., 2 bits) per memory cell. However, the various embodiments are not limited to memory cells storing four data states. Cell 604 is shown as a schematic representation of the memory cells 602 of the array 600 such as those shown in FIG. 1, for example. The array of FIG. 6 has also been simplified to focus on the memory cell locations 600 of the array and not the exact schematic representation of each memory cell of the array. Although memory cells that have been designated as reference cells (e.g., 614) are unavailable to store user data, control circuitry of the memory device may be configured to reallocate the physical locations of reference cells in the array of memory cells. Thus, reference cells according to various embodiments of the present disclosure may reside in fixed memory locations or may be dynamically allocated throughout the array of memory cells 600. The empty circles 612 of FIG. 6 illustrate memory cell locations designated (e.g., assigned), either dynamically or permanently, as user data memory cells. Reference cell locations, such as 616 and 618 for example, are shown as programmed to their respective reference states such as L1 or L3. Sensing devices 610 for each column 608 are illustrated in FIG. 6, however source and drain select gates, such as 150 and 148 shown in FIG. 1, are not shown in FIG. 6 to improve readability of the Figure.

An embodiment utilizing an interpolation method according to one or more of the embodiments of the present disclosure such as illustrated by FIG. 6, benefits from a reduction in the total number of memory cells of the array that are used as reference cells. According to various embodiments of the present disclosure, reference cells are only programmed to a subset of the data states of the memory cells in the array. As illustrated in FIG. 6, reference cells have been programmed only to reference states L1 and L3 corresponding to range 1 208 and range 3 204, respectively, of FIG. 2. The reference cells of FIG. 6 programmed to reference states L1 and L3 thereby comprise a subset of the total data states Level1-Level4 as shown in FIG. 2, for example.

Figure 7:
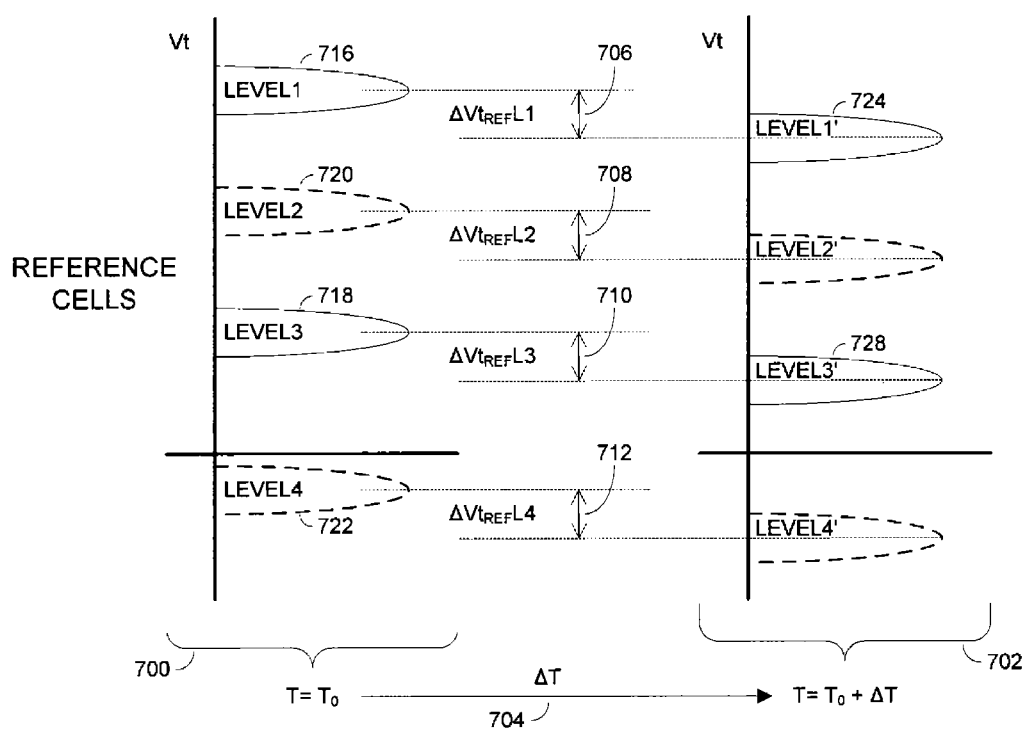
FIG. 7 illustrates a graphical plot of drift of programmed states over time of memory cells storing reference data according to an embodiment of the present disclosure.

Programmed reference cells such as 616,618 are initially programmed to their respective initial data state, Level1 for 616 and Level3 for 618, respectively, for example. After some period of time, the threshold voltages of the reference cells 616,618 may have shifted (e.g., drifted) by some amount. These reference cells 616,618 can be read to determine their present threshold voltage. Control circuitry, discussed subsequently with respect to FIG. 10, of a memory device according to one or more embodiments of the present disclosure, maintains the physical and/or logical location of reference cells in the memory array. Additional information such as the initial programmed threshold voltage of the reference cells is also maintained by the control circuitry according to the various embodiments of the present disclosure. The initial programmed reference states of the reference cells such as 616,618 are illustrated by way of reference to FIG. 7. FIG. 7 illustrates initial programmed reference states 700 of reference cells according to one or more embodiments of the present disclosure. For example, FIG. 7 shows the reference state Level1 716 corresponding to the Level1 (L1) reference cells of FIG. 6 such as cell 616. FIG. 7 also shows the reference state Level3 718 corresponding to the Level3 (L3) reference cells of FIG. 6 such as cell 618. FIG. 7 also shows, as indicated by dashed lines, the reference states of reference cells if reference cells of the array 600 had been programmed to Level2 720 or Level4 722 states. However, as discussed above with respect to FIG. 6, reference cells have not been programmed to the Level2 or Level4 reference states according to various embodiments of the present disclosure. It should also be noted that state Level4, such as 202,722 typically represents an erased state of a memory cell. Thus, prior erase operations may have been performed on cells to put these cells in the Level4 (e.g., erased) state. However, reference is made to programming to a Level4 state for example due to the potential for cells to drift from an initial Level4 (e.g., erased) state. FIG. 7 also illustrates that after a given period of time has elapsed, $\Delta T$ 704, the programmed reference cells may drift from their initial programmed reference states denoted by Level1-Level4 700 to a present threshold voltage denoted by ranges Level1'-Level4' 702. (Note that in FIG. 7 and with respect to FIG. 6, no reference cells have been programmed to a Level2 720 or Level4 722 state.) The potential drift corresponding to each reference state is indicated by $\Delta V_{tREFL1}$ through $\Delta V_{tREFL4}$ 706-712. As no reference cells have been programmed to states Level2 720 and Level4 722, the amount of drift 708 and 712 cannot be directly measured as can be done with 706 and 710, for example.

Despite the fact that there are only reference cells of the array 600 programmed to two (e.g., L1, L3) out of the four possible data states (e.g., L1, L2, L3, L4), memory cells of the array 600 when programmed with user data may be programmed to any of the possible data states Level1-Level4, such as 202-208, for example. The actual drift of programmed reference cells (e.g., 616, 618) can be determined by performing a read operation on the particular reference cell or cells. As the initial reference state for programmed reference cells are maintained by control circuitry of the memory device, a drift 706,710 in a programmed reference cell threshold voltage may be determined by measuring the difference between the present threshold voltage of the reference cell 724,728, as determined by performing a read operation on the programmed reference cell(s), and the known initial programmed threshold voltage for each programmed reference cell 716,718. For example, control circuitry of the memory device maintains that reference cell 616 was initially programmed to a state Level1 716. According to various embodiments, the control circuitry may maintain initial programmed threshold voltages for individual reference cells or may maintain the initial programmed threshold voltages for one or more strings of reference cells all having been programmed to the same reference state, such as string 614. At some later time (e.g., $\Delta T$ 704), a read operation is performed on reference cell 616 to determine its present threshold voltage 724. The amount of drift, $\Delta V_{tREF}L1$ 706, can then be determined from the difference between the initial threshold voltage 716 of reference cell 616 and the present threshold voltage 724 of reference cell 616. Thus, the actual drift of programmed reference cells can be determined directly by performing a read operation of the reference cells at some particular point in time according to one or more embodiments of the present disclosure. The amount of drift determined for each reference cell state (e.g., 706, 710) can then be applied to memory cells storing user data initially programmed to the corresponding state.

After determining $\Delta V_{tREF}L1$ 706 as discussed above, it can be assumed that the same amount of drift has occurred in memory cells storing user data (e.g., 612) that were initially programmed to a Level1 state such as that corresponding to the range 208 of FIG. 2. Thus, according to the example illustrated by way of reference to FIGS. 6 and 7, actual reference cell drift values can be determined through direct read operations performed on the programmed reference cells 616,618. However, according to the various embodiments and as illustrated by FIGS. 6 and 7, not all possible data states (e.g., L1-L4) have been correspondingly programmed into reference cells. For example, a memory cell storing user data (e.g., 612) can be programmed to a Level2 or Level4 state. However, no reference cells of array 600 have been programmed to these states. According to the various embodiments, a method can be utilized for estimating (e.g., interpolating) the possible drift of memory cells storing user data programmed to states not represented by programmed reference cells in the array. Thus, various methods can negate the need for reference cells having to be programmed to each possible data state thereby increasing the efficient use of the memory array to store user data.

For example, one or more Level1 reference cells, such as 616, can be read to determine their present threshold voltage 724. In the case of multiple Level1 reference cells being read, an average read value might be generated to determine a single Level1 reference threshold voltage present value 724, for example. This present threshold voltage for Level1 reference cells can then be compared to their initial threshold voltage to determine an amount of drift (e.g., $\Delta V_{tREF}L1$ 706) in Level1 reference cells, for example. One or more Level3 reference cells, such as 618,614, can also be read to determine their present threshold voltage(s) 728 as well. Again, if more than one Level3 reference cell is read the resulting threshold voltages might be averaged or processed in some other manner to arrive at a single present value for Level3 728 reference cells. This present value for the Level3 reference cells can then be compared to the initial threshold voltage to determine an amount of drift (e.g., $\Delta V_{tREF}L3$ 710) in Level3 reference cells, for example. Data processing other than generating an average read value for programmed reference cells may also be utilized to arrive at a present reference amount of drift according to various embodiments of the present disclosure.

Based on the determined drift values (e.g., $\Delta V_{tREF}L1$ 706 and $\Delta V_{tREF}L3$ 710), an estimation is made to generate (e.g., interpolate) an estimated drift value 708,712 for data states that were not programmed in to reference cells, such as Level2 and Level4 in FIGS. 6 and 7. For example, according to one or more embodiments of the present disclosure, $\Delta V_{tREF}L2$ 708 and/or $\Delta V_{tREF}L4$ 712 can be estimated from the drift values $\Delta V_{tREF}L1$ 706 and $\Delta V_{tREF}L3$ 710. For example, $\Delta V_{tREF}L2$ 708 might be determined by calculating the average of drift $\Delta V_{tREF}L1$ 706 and $\Delta V_{tREF}L3$ 710. However, the various embodiments are not limited to determining average values to generate estimate drift values of data states for reference cells which were not programmed in reference cells of the array of memory. The estimated drift values, such as $\Delta V_{tREF}L2$ 708 and $\Delta V_{tREF}L4$ 712, might be a linear or non-linear function of the drifts determined for programmed reference cells 706,710 according to various embodiments of the present disclosure, for example. Following the calculation to determine the estimated drift values $\Delta V_{tREF}L2$ 708 and/or $\Delta V_{tREF}L4$ 712, these estimated drift values can be used to estimate the drift occurring in user data memory cells 612, such as those programmed to a Level2 or a Level4 data state, for example.

The various embodiments, however, are not limited to programming all odd or all even reference states. One or more of various embodiments of the present disclosure encompass programming reference cells to a subset of reference states of all the possible data states of the memory cells of the memory array. For example, in an array of memory cells configured to store data states Level1-Level8 (L1-L8), the reference cells according to one or more embodiments might be programmed to states L2, L3, L6 and L7, for example. Additional embodiments might only program reference cells to states L1, L2, L5, L7 and L8, for example. Various embodiments are not limited to generating an estimated drift determined from only two measured reference cells. One or more embodiments can use various combinations of measured reference cells and reference cell states in order to generate an estimated drift value. In addition, one or more embodiments may also utilize a combination of measured results and estimated (e.g., previously and/or currently) drift values to generate additional drift estimates, for example.

Figure 8:
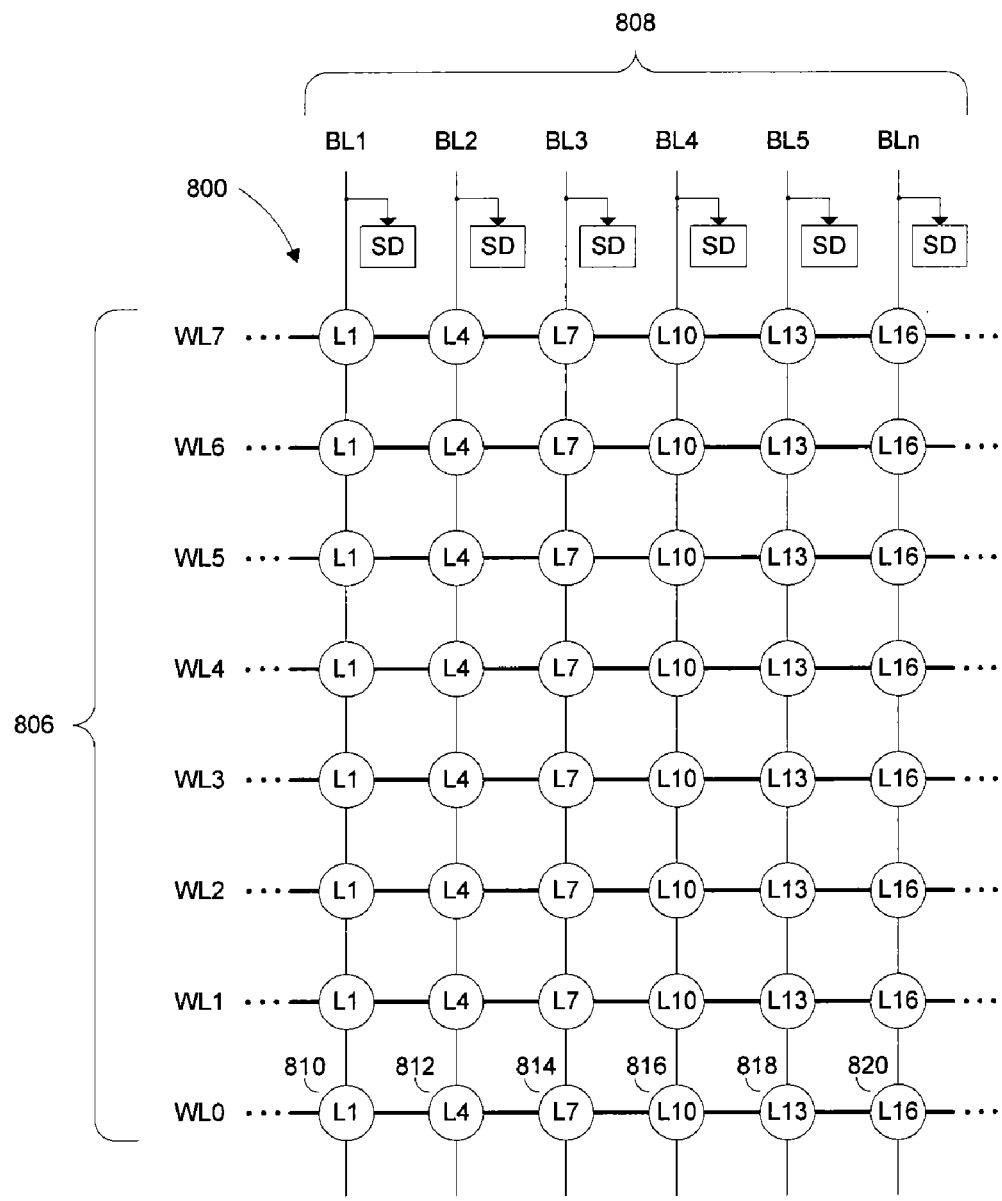
FIG. 8 shows another arrangement of reference cells according to an embodiment of the present disclosure.

FIG. 8 illustrates an example of an additional interpolation embodiment according to various embodiments of the present disclosure. The array of memory cells 800 illustrated in FIG. 8 has been simplified to improve readability of the Figure. Although not shown in the Figure, additional memory cells (e.g., user and/or reference) can exist as part of the memory array 800. The memory cells of FIG. 8, according to at least one embodiment, are MLC (sixteen level) (e.g., having L1-L16 levels) memory cells such as those which might store 4 bits per cell, for example. According to an embodiment as illustrated in FIG. 8, reference cells are programmed to states L1, L4, L7, L10, L13 and L16 810-820. Thus, according to interpolation methods of various embodiments of the present disclosure, the number of reference cells has been reduced by more than half in comparison with an array wherein reference cells are programmed with all possible data states L1-L16. This can be used to increase the amount of memory available in the memory device to store user data. The various embodiments are not limited to a single string of each type of reference cell as illustrated in FIG. 8. For example, there may exist multiple strings of reference cells having the same programmed state. In addition, arrays of reference cells according to the various embodiments may comprise different numbers of strings programmed to each reference state. For example, an array such as 800 might have many more strings of reference cells programmed to the Level7 814 and Level10 816 reference states than strings of the remaining reference states 810,812,818 and 820. Additional embodiments may comprise a greater number of strings of reference cells at the two extremes of data states, such as states L1 810 and L16 820, for example.

As discussed above with respect to FIGS. 6 and 7, estimations for threshold drifts occurring in user memory cells programmed to states not represented by programmed reference cells, such as L2-L3, L5-L6, L8-L9, L11-L12 and L14-L15 in FIG. 8, can be made using various interpolation methods according to various embodiments of the present disclosure. For example, an estimation of drift occurring in memory cells programmed with user data programmed to Level9 can be accomplished by way of methods according to various embodiments. According to one or more embodiments, reference cells programmed to Level10 (L10) 816 and Level7 (L7) 814 can be read to determine the drift having occurred in those reference cells. The estimated drift of user data memory cells programmed to a Level9 state can then be estimated based on the drift values of L10 and L7 reference cells. An average drift value of all the Level10 816 and the Level7 814 reference cells can be used as the estimated drift value for user data memory cells programmed to a Level9 state, for example.

A further embodiment according to the present disclosure might perform a read operation on some or all of the programmed reference cells to generate an estimation for the drift of user data memory cells programmed to a Level9, or some other data state not programmed into a reference cell, for example. For example, all of the programmed reference cells (e.g., L1, L4, L7, L10, L13, L16) 810-820 shown in FIG. 8 might be read and the results used to estimate a drift for user data memory cells programmed to a Level9 state. Further embodiments, might read and determine a corresponding drift value of different groups of reference cells in order to generate an estimate for cells programmed to a Level9, or other data state not programmed into a reference cell. The various embodiments are not limited to utilizing an averaging function to generate estimated drift values. The various embodiments may utilize various statistical and other mathematical functions as are known to those skilled in the art to arrive at the estimated drift values.

Figure 9:
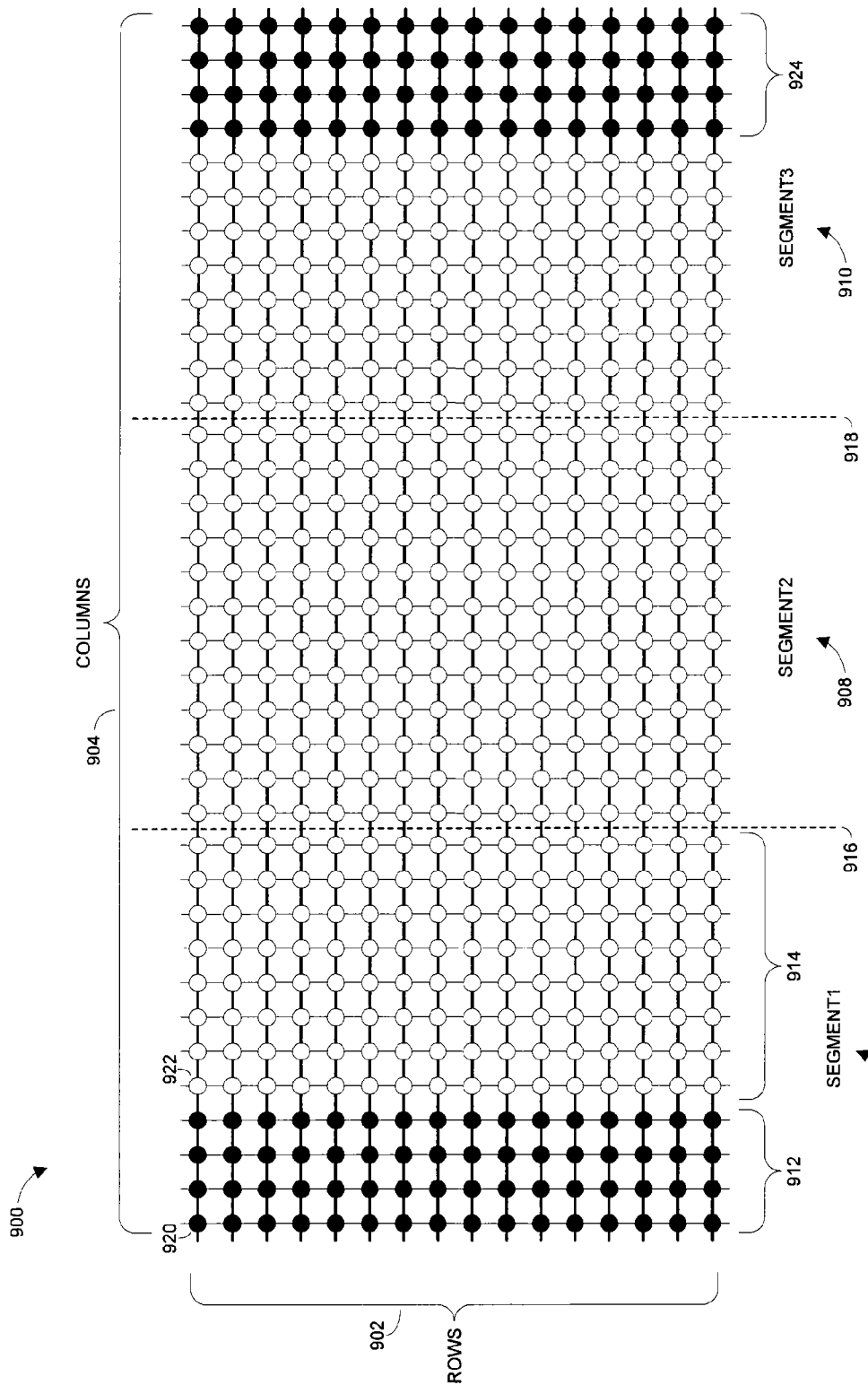
FIG. 9 shows a schematic representation of memory cells utilizing a location interpolation scheme according to an embodiment of the disclosure.

An additional interpolation method according to one or more embodiments of the present disclosure is a interpolation method, such as the one described by way of reference to FIG. 9. FIG. 9 illustrates an array (e.g., block) of memory cells 900 shown further divided into three segments of memory cells Segment1 906, Segment2 908 and Segment3 910. Although FIG. 9 illustrates the three segments 906-910 as a continuous array of memory cells coupled by rows 902, the various embodiments are not so limited. Each segment 906-910 may reside in the same memory device but may exist on a separate die (e.g., chips), for example. Additional embodiments comprise different configurations wherein each segment 906-910 may be physically and/or electrically separated from each other as indicated by dashed lines 916/918. The memory cells illustrated in FIG. 9, represented by circles, are differentiated by assigned functionality. For example, the solid memory cells 920 of FIG. 9 represent memory cells that have been designated, either permanently or dynamically, as reference cells. The empty memory cells 922 represent memory cells designated, either permanently or dynamically, as memory cells to store user data. It should be noted that FIG. 9 is a simplified illustration and many more rows 902, columns 904, memory cell blocks 900 and segments of memory cells 906-910 may exist as is known to those skilled in the art. Source select gates 150 and drain select gates 148 along with sense devices 140, such as those shown in FIG. 1, are not shown in FIG. 9 to improve readability of the Figure.

According to one or more embodiments of the present disclosure, Segment1 906 can be programmed with reference cells 920 utilizing the various reference cell programming method embodiments such as those discussed above with respect to FIGS. 6 and 8. For example, Segment1 906 might be comprised of memory cells 912/914 configured as MLC (four level) (e.g., L1-L4 level) memory. However, the various embodiments are not limited to MLC (four level) memory. The solid memory cells 920 of FIG. 9 may be programmed as reference cells to each of the possible reference states (e.g., L1-L4) or may be programmed using a subset of possible reference states according to various embodiments of the present disclosure such as those shown (e.g., L1, L3) in FIG. 6, for example. Memory cells 914 are designated as user data memory cells and thereby may be programmed to data states L4-L1, such as those represented by ranges 202-208 of FIG. 2, for example. Similar to Segment1 906, Segment3 910 can also be programmed with reference cells 924 utilizing the various reference cell programming method embodiments such as those discussed above with respect to FIGS. 6 and 8 and presently with respect to Segment1 906. Memory cells of Segment2 908 in the example illustrated in FIG. 9 are programmed only as user data cells.

According to various embodiments of the present disclosure, memory cells programmed as reference cells 912,924 of Segment1 906 and Segment3 910, are utilized to interpolate drift values for user data memory cells of Segment2 908. For example, reference cells 912 from Segment1 906 and reference cells 924 from Segment3 910 programmed to a reference state of Level3 can be utilized according to one or more methods of the various embodiments of the present disclosure to estimate the drift in the user data memory cells of Segment2 908 which have been programmed to a Level3 state. For example, reference cells 912 of Segment1 906 and reference cells 924 of Segment3 910 can be read to determine their present threshold voltage. Then, by comparing the known initial threshold voltage of the reference cells and their present threshold voltage, a drift value, such as $\Delta V_{tREF}L1$ 706 and $\Delta V_{tREF}L3$ 710 as discussed with respect to FIG. 7, can be determined for reference cells programmed to a particular reference state. According to one or more embodiments, the determined drift values for the reference cells 912 and 924 may be combined to determine a single drift value for each programmed reference state or a drift value for each population (e.g., 912,924) may be determined and used as independent values. The drift value for the reference cells 912,924 of Segment1 906 and Segment3 910 may be combined or used separately to make a determination of the estimated drift value to be used with respect to the user data cells of Segment2 908, for example. According to additional embodiments, both the interpolation scheme as described above with respect to FIGS. 6, 7 and 8 and the interpolation scheme as described with reference to FIG. 9 can be utilized together or independently. For example, each population of reference cells 912,924 of FIG. 9 might be programmed with reference cells such as shown in FIG. 8. Thus, one or more embodiments allow for the interpolation method as illustrated with respect to FIG. 8 and the interpolation method illustrated with respect to FIG. 9 to be utilized in conjunction to arrive at an estimated drift value for user data memory cells of Segment2 908 programmed to any of the data states L2-L3, L5-L6, L8-L9, L11-L12 and L14-L15, for example.

Both interpolation methods described according to the various embodiments of the present disclosure can reduce the number of memory cells required for use as reference cells. This thereby effectively increases the efficiency of the memory device by increasing the amount of memory cells available for storage of user data.

Figure 10:
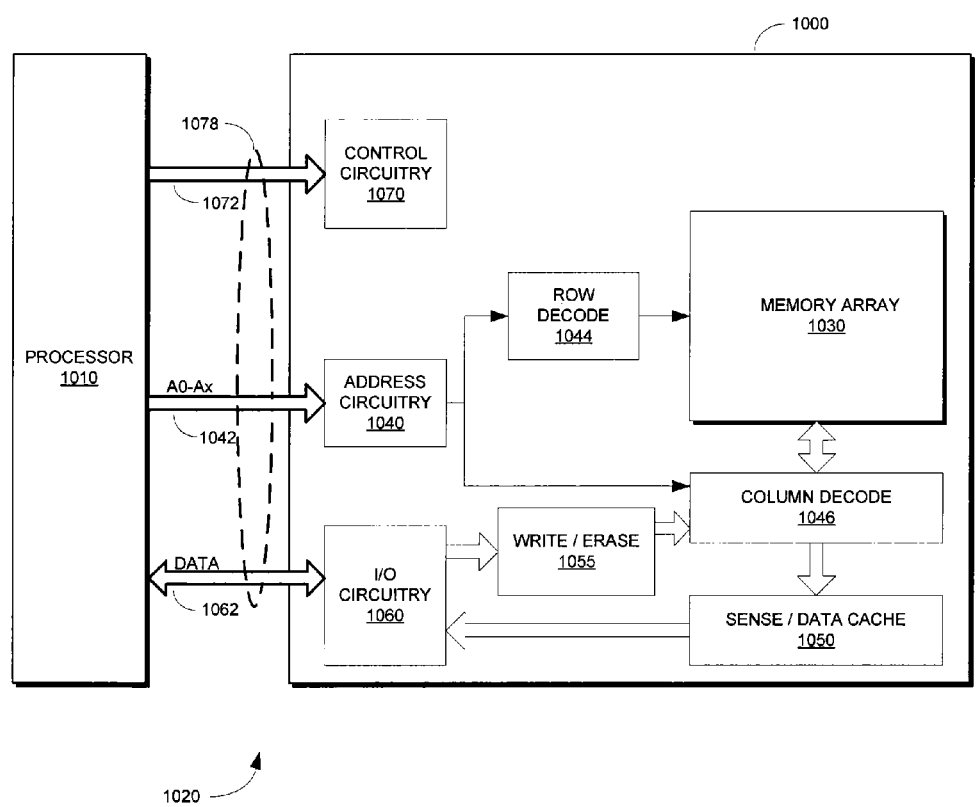
FIG. 10 shows a block diagram of a memory system that incorporates various embodiments of the present disclosure.

FIG. 10 is a functional block diagram of an electronic system having at least one memory device according to one or more embodiments of the present disclosure. The memory device 1000 illustrated in FIG. 10 is coupled to a host such as a processor 1010. The processor 1010 may be a microprocessor or some other type of controlling circuitry. The memory device 1000 and the processor 1010 form part of an electronic system 1020. The memory device 1000 has been simplified to focus on features of the memory device that are helpful in understanding various embodiments of the present disclosure.

The memory device 1000 includes one or more arrays of memory cells 1030 that can be arranged in banks of rows and columns. Memory array 1030 may comprise SLC and/or MLC memory, for example. According to one or more embodiments, these memory cells of memory array 1030 are flash memory cells. The memory array 1030 can consist of multiple banks, blocks and segments of memory cells residing on a single or multiple die as part of the memory device 1000. The memory cells of the memory array 1030 may also be adaptable to store varying densities (e.g., MLC (four level) and MLC (eight level)) of data in each cell.

An address buffer circuit 1040 is provided to latch address signals provided on address input connections A0-Ax 1042. Address signals are received and decoded by a row decoder 1044 and a column decoder 1046 to access the memory array 1030. It will be appreciated by those skilled in the art, with the benefit of the present description, that the number of address input connections 1042 depends on the density and architecture of the memory array 1030. That is, the number of addresses increases with both increased memory cell counts and increased bank and block counts.

The memory device 1000 reads data in the memory array 1030 by sensing voltage or current changes in the memory array columns using sense devices, such as sense/data cache circuitry 1050. The sense/data cache circuitry 1050, in at least one embodiment, is coupled to read and latch a row of data from the memory array 1030. Sense/data cache circuitry can be used as the sense devices 140-146 discussed with respect to FIG. 1. Data input and output buffer circuitry 1060 is included for bi-directional data communication over a plurality of data connections 1062 with the processor 1010. Write circuitry 1055 is provided to write data to the memory array 1030.

Control circuitry 1070 is configured at least in part to implement the methods of various embodiments of the present disclosure, such as the various interpolation methods, for example. In at least one embodiment, the control circuitry 1070 may utilize a state machine. Control signals and commands can be sent by the processor 1010 to the memory device 1000 over the command bus 1072. The command bus 1072 may be a discrete signal or may be comprised of multiple signals, for example. These command signals 1072 are used to control the operations on the memory array 1030, including data read, data write (program), and erase operations. The command bus 1072, address bus 1042 and data bus 1062 may all be combined or may be combined in part to form a number of standard interfaces 1078. For example, the interface 1078 between the memory device 1000 and the processor 1010 may be a Universal Serial Bus (USB) interface. The interface 1078 may also be a standard interface used with many hard disk drives (HDD.) For example, the interface may take the form of an SATA or PATA interface. Other HDD interfaces are known to those skilled in the art.

The electronic system illustrated in FIG. 10 has been simplified to facilitate a basic understanding of the features of the memory and is for purposes of illustration only. A more detailed understanding of internal circuitry and functions of non-volatile memories are known to those skilled in the art.

CONCLUSION

Various embodiments of the present disclosure provide methods for interpolating threshold voltage drift, for example. Also disclosed are apparatus configured to perform the methods of various embodiments of the present disclosure. According to various embodiments of the present disclosure, a reduction in the number of reference cells utilized in a memory device can be realized.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of operating a memory device, comprising:
   determining a threshold voltage drift of two or more reference memory cells of the memory device programmed to only a subset of data states of the memory device; and
   using the determined threshold voltage drift of the two or more reference memory cells, estimating a threshold voltage drift of one or more user data memory cells programmed to a data state of the memory device that is mutually exclusive to the subset of data states of the memory device.

2. The method of claim 1, wherein determining a threshold voltage drift of the two or more reference memory cells comprises reading the two or more reference memory cells to determine their threshold voltages, and determining a difference between the determined threshold voltages and stored initial programmed voltages.

3. The method of claim 1, wherein determining a threshold voltage drift of the two or more reference memory cells comprises, for each data state of the subset of data states, reading one or more reference memory cells programmed to that data state to determine their threshold voltages, averaging the determined threshold voltages for that data state, and determining a difference between the average determined threshold voltage for that data state and a stored initial programmed voltage for that data state.

4. The method of claim 1, wherein estimating the threshold voltage drift of one or more user data memory cells programmed to a data state of the memory device that is mutually exclusive to the subset of data states of the memory device comprises interpolating between the threshold voltage drift of one or more of the reference cells programmed to a data state below a particular data state of the memory device that is mutually exclusive to the subset of data states of the memory device and the threshold voltage drift of one or more of the reference cells programmed to a data state above that particular data state.

5. The method of claim 4, wherein interpolating comprises interpolating between threshold voltage drifts of data states adjacent to the particular data state.

6. The method of claim 1, wherein estimating a threshold voltage drift of one or more user data memory cells programmed to a data state of the memory device that is mutually exclusive to the subset of data states of the memory device comprises determining a function of threshold voltage drift using the determined threshold voltage drift of the two or more reference memory cells.

7. The method of claim 6, wherein determining a function comprises determining a function selected from the group consisting of a linear function and a non-linear function.

8. The method of claim 1, wherein using the determined threshold voltage drift of the two or more reference memory cells comprises using the determined threshold voltage drift of reference memory cells programmed to two or more data states of the memory device.

9. The method of claim 1, wherein using the determined threshold voltage drift of the two or more reference memory cells comprises using the determined threshold voltage drift of reference memory cells programmed to each data state of the subset of data states.

10. The method of claim 1, wherein determining a threshold voltage drift of two or more reference memory cells of the memory device programmed to only a subset of data states of the memory device comprises determining threshold voltages of one or more first reference memory cells having an initial programmed threshold voltage corresponding to a first data state of the memory device and determining a difference between the threshold voltages of the one or more first reference memory cells and their initial programmed threshold voltages.

11. The method of claim 1, wherein determining a threshold voltage drift of two or more reference memory cells of the memory device programmed to only a subset of data states of the memory device comprises determining a threshold voltage drift of two or more reference memory cells of the memory device programmed to only a subset of two or more data states of the memory device.

12. A method of operating a memory device, comprising:
determining threshold voltages of one or more first memory cells having an initial programmed threshold voltage corresponding to a first data state of the memory device;
determining threshold voltages of one or more second memory cells having an initial programmed threshold voltage corresponding to a second data state of the memory device;
determining a difference between the threshold voltages of the one or more first memory cells and their initial programmed threshold voltages;
determining a difference between the threshold voltages of the one or more second memory cells and their initial programmed threshold voltages; and
estimating a threshold voltage drift of one or more third memory cells using the determined difference between the threshold voltages of the one or more first memory cells and their initial programmed threshold voltages and the determined difference between the threshold voltages of the one or more second memory cells and their initial programmed threshold voltages, wherein the one or more third memory cells have an initial programmed threshold voltage corresponding to a third data state.

13. The method of claim 12, further comprising:
determining threshold voltages of one or more fourth memory cells having an initial programmed threshold voltage corresponding to a fourth data state of the memory device;
determining a difference between the threshold voltages of the one or more fourth memory cells and their initial programmed threshold voltages; and
estimating the threshold voltage drift of the one or more third memory cells using the determined difference between the threshold voltages of the one or more first memory cells and their initial programmed threshold voltages, the determined difference between the threshold voltages of the one or more second memory cells and their initial programmed threshold voltages, and the determined difference between the threshold voltages of the one or more fourth memory cells and their initial programmed threshold voltages.

14. The method of claim 12, wherein determining a difference between the threshold voltages of the one or more first memory cells and their initial programmed threshold voltages comprises determining an average of the differences between the threshold voltages and their initial programmed threshold voltages of two or more of the first memory cells.

15. The method of claim 12, wherein estimating a threshold voltage drift of one or more third memory cells using the determined difference between the threshold voltages of the one or more first memory cells and their initial programmed threshold voltages and the determined difference between the threshold voltages of the one or more second memory cells and their initial programmed threshold voltages comprises applying a statistical function to at least the determined difference between the threshold voltages of the one or more first memory cells and their initial programmed threshold voltages and the determined difference between the threshold voltages of the one or more second memory cells and their initial programmed threshold voltages.

16. A memory device, comprising:
an array of memory cells comprising one or more user data memory cells and two or more reference memory cells; and
control circuitry configured to maintain locations of the two or more reference memory cells and initial programmed threshold voltages of the two or more reference memory cells;
wherein the initial programmed threshold voltages of the two or more reference memory cells correspond to only a subset of data states of the memory device.

17. The memory device of claim 16, wherein the locations of the two or more reference memory cells are selected from the group consisting of physical locations and logical locations.

18. The memory device of claim 16, wherein the locations of the two or more reference memory cells are dynamically allocated.

19. The memory device of claim 16, wherein the subset of data states corresponds to data states selected from the group consisting of even data states, odd data states, and a subset of both even data states and odd data states.

20. The memory device of claim 19, wherein the subset of both even data states and odd data states comprises every third data state.

21. The memory device of claim 16, wherein the two or more reference memory cells comprises two of more reference memory cells having initial programmed threshold voltages corresponding to each data state of the subset of data states.

22. The memory device of claim 21, wherein there are more reference memory cells corresponding to a lowest data state and a highest data state of the subset of data states than reference memory cells corresponding to other data states of the subset of data states, wherein the lowest data state corresponds to a threshold voltage range lower than any other data state of the subset of data states, and wherein the highest data state corresponds to a threshold voltage range higher than any other data state of the subset of data states.

23. The memory device of claim 16, wherein the array of memory cells are contained on two or more die, and wherein one or more of the die contain only user data memory cells.

24. The memory device of claim 23, wherein one or more of the reference memory cells are contained on a first die and have initial programmed threshold voltages corresponding to a particular data state of the subset of data states, and wherein one or more of the reference memory cells are contained on a second die and have initial programmed threshold voltages corresponding to the particular data state of the subset of data states.

25. The memory device of claim 16, wherein the control circuitry is configured to maintain the initial programmed threshold voltages of each of the two or more reference memory cells.

26. The memory device of claim 16, wherein the control circuitry is configured to maintain the initial programmed threshold voltages of one or more NAND strings of reference memory cells.

* * * * *

UNITED STATES PATENT AND TRADEMARK OFFICE
CERTIFICATE OF CORRECTION

Page 1 of 1

PATENT NO. : 8,031,529 B2
APPLICATION NO. : 12/871252
DATED : October 4, 2011
INVENTOR(S) : Vishal Sarin It is certified that error appears in the above-identified patent and that said Letters Patent is hereby corrected as shown below:

In column 14, line 33, in Claim 21, delete "two of more" and insert -- two or more --, therefor.

Signed and Sealed this
Twentieth Day of December, 2011

David J. Kappos
*Director of the United States Patent and Trademark Office*